(12) United States Patent
Pitts et al.

(10) Patent No.: US 12,258,948 B2
(45) Date of Patent: Mar. 25, 2025

(54) PHASE CHANGE MATERIAL (PCM)-BASED CONDUCTIVE THERMAL ACTUATOR SWITCHES AND ASSOCIATED STACKED AND ARRAYED SYSTEMS

(71) Applicant: Raytheon Company, Waltham, MA (US)

(72) Inventors: Andrew J. Pitts, Maynard, MA (US); Adam C. Wood, Oro Valley, AZ (US)

(73) Assignee: Raytheon Company, Arlington, VA (US)

( * ) Notice: Subject to any disclaimer, the term of this patent is extended or adjusted under 35 U.S.C. 154(b) by 0 days.

(21) Appl. No.: 18/361,311

(22) Filed: Jul. 28, 2023

(65) Prior Publication Data
US 2024/0093678 A1 Mar. 21, 2024

Related U.S. Application Data

(60) Provisional application No. 63/375,877, filed on Sep. 16, 2022.

(51) Int. Cl.
*F03G 7/06* (2006.01)
*F28F 13/00* (2006.01)
(Continued)

(52) U.S. Cl.
CPC .......... *F03G 7/06114* (2021.08); *F28F 13/00* (2013.01); *H01M 10/60* (2015.04); *F28F 2013/008* (2013.01); *H01L 23/4275* (2013.01)

(58) Field of Classification Search
CPC ........ F03G 7/06; F03G 7/061; F03G 7/06112; F03G 7/06113; F03G 7/06114; F28F 2013/008
See application file for complete search history.

(56) References Cited

U.S. PATENT DOCUMENTS

| 3,463,224 A | 8/1969 | Myers |
|---|---|---|
| 4,212,346 A | 7/1980 | Boyd |

(Continued)

FOREIGN PATENT DOCUMENTS

| CN | 113097599 A | 7/2021 |
|---|---|---|
| WO | 2023044410 A1 | 3/2023 |

OTHER PUBLICATIONS

Lankford, "10 Heat Switches," 2007, 19 pages.
(Continued)

*Primary Examiner* — Loren C Edwards

(57) ABSTRACT

An apparatus includes a thermal actuator switch configured to control a transfer of thermal energy through the thermal actuator switch. The thermal actuator switch includes first and second plates and a piston movable laterally between the first and second plates. The thermal actuator switch also includes a phase change material configured to (i) expand to move a surface of the piston into a first position and (ii) contract to allow the surface of the piston to move into a second position. The surface of the piston thermally contacts the first plate and increases thermal energy transfer between the first and second plates when in one of the first and second positions. The surface of the piston is spaced apart from the first plate and decreases thermal energy transfer between the first and second plates when in another of the first and second positions.

20 Claims, 5 Drawing Sheets

(51) Int. Cl.
*H01M 10/60* (2014.01)
*H01L 23/427* (2006.01)

(56) References Cited

U.S. PATENT DOCUMENTS

| | | | | |
|---|---|---|---|---|
| 4,388,965 | A | * | 6/1983 | Cunningham ....... G05D 23/192 |
| | | | | 165/277 |
| 5,317,875 | A | * | 6/1994 | O'Brien ................ G02B 7/004 |
| | | | | 60/527 |
| 6,308,518 | B1 | | 10/2001 | Hunter |
| 8,956,021 | B2 | | 2/2015 | Hessling |
| 9,234,682 | B2 | | 1/2016 | Edwards et al. |
| 10,809,747 | B2 | | 10/2020 | Andres |
| 2006/0087816 | A1 | | 4/2006 | Ewes et al. |
| 2007/0257766 | A1 | * | 11/2007 | Richards ................ F28D 15/06 |
| | | | | 62/3.1 |
| 2014/0363718 | A1 | * | 12/2014 | Andres ............... H01M 10/613 |
| | | | | 165/277 |
| 2017/0321966 | A1 | | 11/2017 | Lueckenbach |
| 2020/0217518 | A1 | | 7/2020 | Field et al. |
| 2020/0371155 | A1 | | 11/2020 | Walczyk et al. |

OTHER PUBLICATIONS

Wang et al., "Development of a phase change material (PCM)-based thermal switch," Hkie Transactions, vol. 24, No. 2, 2017, 6 pages.
Geng et al., "A self-adaptive thermal switch array for rapid temperature stabilization under various thermal power inputs," Journal of Micromechanics and Microengineering, Jul. 2011, 9 pages.
International Search Report and Written Opinion of the International Searching Authority dated Dec. 1, 2022 in connection with International Patent Application No. PCT/US2022/076532, 8 pages.
International Search Report and Written Opinion of the International Searching Authority dated Nov. 6, 2023 in connection with International Patent Application No. PCT/US2023/029004, 11 pages.

* cited by examiner

PHASE CHANGE MATERIAL (PCM)-BASED CONDUCTIVE THERMAL ACTUATOR SWITCHES AND ASSOCIATED STACKED AND ARRAYED SYSTEMS

CROSS-REFERENCE TO RELATED APPLICATION AND PRIORITY CLAIM

This application claims priority under 35 U.S.C. § 119(e) to U.S. Provisional Patent Application No. 63/375,877 filed on Sep. 16, 2022, which is hereby incorporated by reference in its entirety.

TECHNICAL FIELD

This disclosure is generally directed to thermal systems. More specifically, this disclosure is directed to phase change material (PCM)-based conductive thermal actuator switches and associated stacked and arrayed systems.

BACKGROUND

Thermal management is typically required or desired in various electronic devices, powered systems, and other devices or systems where thermal energy (heat) can adversely impact performance of or damage device or system components. For example, batteries often experience heating during use, and thermal management is typically required or desired in order to maintain the batteries within specified temperature ranges. These temperature ranges can be defined to maintain operational efficiency of the batteries, ensure long-term usage of the batteries, or avoid damage to the batteries.

SUMMARY

This disclosure is directed to phase change material (PCM)-based conductive thermal actuator switches and associated stacked and arrayed systems.

In a first embodiment, an apparatus includes a thermal actuator switch configured to control a transfer of thermal energy through the thermal actuator switch. The thermal actuator switch includes first and second plates and a piston movable laterally between the first and second plates. The thermal actuator switch also includes a phase change material configured to (i) expand to move a surface of the piston into a first position and (ii) contract to allow the surface of the piston to move into a second position. The surface of the piston thermally contacts the first plate and increases thermal energy transfer between the first and second plates when in one of the first and second positions. The surface of the piston is spaced apart from the first plate and decreases thermal energy transfer between the first and second plates when in another of the first and second positions.

In a second embodiment, a system includes at least one heat source, at least one heat sink, and multiple thermal actuator switches configured to control a transfer of thermal energy between the at least one heat source and the at least one heat sink. Each thermal actuator switch includes first and second plates and a piston movable laterally between the first and second plates. Each thermal actuator switch also includes a phase change material configured to (i) expand to move a surface of the piston into a first position and (ii) contract to allow the surface of the piston to move into a second position. The surface of the piston thermally contacts the first plate and increases thermal energy transfer between the first and second plates when in one of the first and second positions. The surface of the piston is spaced apart from the first plate and decreases thermal energy transfer between the first and second plates when in another of the first and second positions.

In a third embodiment, a method includes receiving thermal energy at a thermal actuator switch from at least one heat source. The method also includes controlling a transfer of the thermal energy between the at least one heat source and at least one heat sink using the thermal actuator switch. The thermal actuator switch includes first and second plates and a piston that moves laterally between the first and second plates. The thermal actuator switch also includes a phase change material that (i) expands to move a surface of the piston into a first position and (ii) contracts to allow the surface of the piston to move into a second position. The surface of the piston thermally contacts the first plate and increases thermal energy transfer between the first and second plates when in one of the first and second positions. The surface of the piston is spaced apart from the first plate and decreases thermal energy transfer between the first and second plates when in another of the first and second positions.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
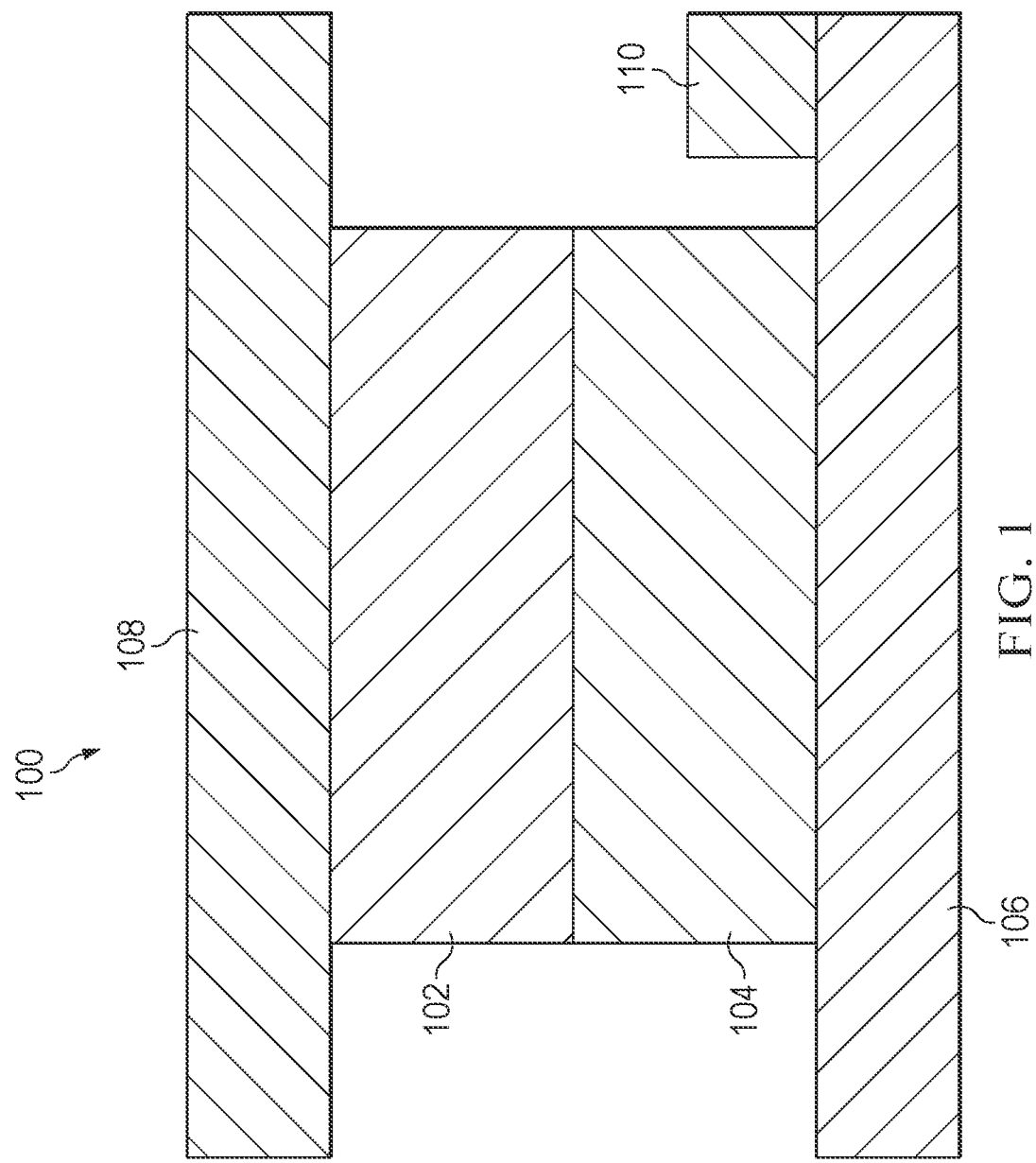
FIG. 1 illustrates a first example stacked arrangement of phase change material (PCM)-based conductive thermal actuator switches according to this disclosure.

FIGS. 1 through 5, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As described above, thermal management is typically required or desired in various electronic devices, powered systems, and other devices or systems where thermal energy (heat) can adversely impact performance of or damage device or system components. For example, batteries often experience heating during use, and thermal management is typically required or desired in order to maintain the batteries within specified temperature ranges. These temperature ranges can be defined to maintain operational efficiency of the batteries, ensure long-term usage of the batteries, or avoid damage to the batteries.

This disclosure provides various thermal actuator switches that can be used for thermal management or other purposes. Each of the thermal actuator switches includes a piston that can be used to form and break a thermal connection or otherwise facilitate and impede thermal energy transfer between at least one heat source (such as a power-dissipating or warmer device) and at least one heat sink (such as a cold plate). At least one phase change material (PCM) in each thermal actuator switch can change phase and expand/contract based on localized heating/cooling in the thermal actuator switch to move the piston within the thermal actuator switch. In some cases, when the phase change material in a thermal actuator switch is heated, the phase change material can expand and move the piston in the thermal actuator switch to form a thermal connection (or improve a thermal connection) between the heat source(s) and the heat sink(s). When the phase change material in the thermal actuator switch is cooled, the phase change material can contract, and a spring-loaded mechanism, a magnet, or other return mechanism can be used to push or pull the piston and break the thermal connection (or lessen the thermal connection) between the heat source(s) and the heat sink(s). Other configurations can have a phase change material that expands when cooled and that contracts when heated, which again can move the piston to form (or improve) and break (or lessen) a thermal connection.

In this way, the phase change material in each thermal actuator switch can be used to provide passive switching of the thermal actuator switch. Also, the actuation of each thermal actuator switch can be used to control the contacting surface area between the piston and another component of the thermal actuator switch, which allows the surface area used for thermal energy transfer to be easily controlled. In some embodiments, the actuation of each thermal actuator switch is linear based on the movement of the piston. Further, through the use of the return mechanism, each thermal actuator switch may be used to repeatedly form and break (or increase and decrease) the thermal connection between the heat source(s) and the heat sink(s).

In addition, multiple thermal actuator switches may be used in any suitable serial and/or parallel arrangement(s) to provide desired thermal energy transfer paths between at least one heat source and at least one heat sink. For example, an array of parallel thermal actuator switches may be positioned across at least one battery or other heat source(s) and used to transfer thermal energy away from the heat source(s). This may be useful, for instance, in reducing or avoiding the creation of a temperature gradient across the surface(s) of the heat source(s). As another example, multiple thermal actuator switches may be stacked in series, such as where different thermal actuator switches have phase change materials that expand/contract at different temperature thresholds. This may, for example, allow the overall thermal transfer behavior of the thermal actuator switches to be tuned for a particular application. As a particular example, this may allow the stacked thermal actuator switches to form/break (or facilitate/inhibit) one or more thermal connections between the heat source(s) and the heat sink(s) at different temperatures. As a result, for instance, one of multiple stacked thermal actuator switches may form or improve a thermal connection between the heat source(s) and the heat sink(s) at a lower temperature to enable a first rate of thermal energy transfer. Another of the stacked thermal actuator switches may form or improve the same or another thermal connection between the heat source(s) and the heat sink(s) at a higher temperature to enable a second (larger) rate of thermal energy transfer. Combinations of these approaches may also be used, such as when multiple sets of series-coupled (stacked) thermal actuator switches are arranged in a parallel array.

FIG. 1 illustrates a first example stacked arrangement 100 of PCM-based conductive thermal actuator switches according to this disclosure. As shown in FIG. 1, the stacked arrangement 100 includes multiple thermal actuator switches 102-104 that are thermally (and possibly mechanically) coupled in series. Each thermal actuator switch 102-104 may represent a separate instance of one of the thermal actuator switches described below, although each thermal actuator switch 102-104 may have any other suitable design in which a piston moves based on expansion/contraction of a phase change material.

In some embodiments, the thermal actuator switches 102-104 include different phase change materials. For instance, the thermal actuator switch 102 may have one or more phase change materials with a lower transition temperature, and the thermal actuator switch 104 may have one or more phase change materials with a higher transition temperature (or vice versa). In some cases, the lower transition temperature may be about 5° C., and the higher transition temperature may be about 25° C. This stacked arrangement 100 therefore allows one of the thermal actuator switches 102-104 to close (such as by expanding or contracting its phase change material) at lower temperatures and both of the thermal actuator switches 102-104 to close at higher temperatures. As a result, this helps to provide tunable thermal isolation in the "thru" direction.

The stacked arrangement 100 allows for passive control of thermal energy transfer between at least one heat source 106 and at least one heat sink 108. The at least one heat source 106 represents any suitable source of thermal energy, such as one or more batteries, processors, or other devices. The at least one heat sink 108 represents any suitable destination for the thermal energy, such as at least one cold plate. Note that the at least one heat source 106 may optionally include or be associated with one or more heaters 110, such as in a cold environment where the heater(s) 110 may be needed to heat one or more devices.

Figure 2:
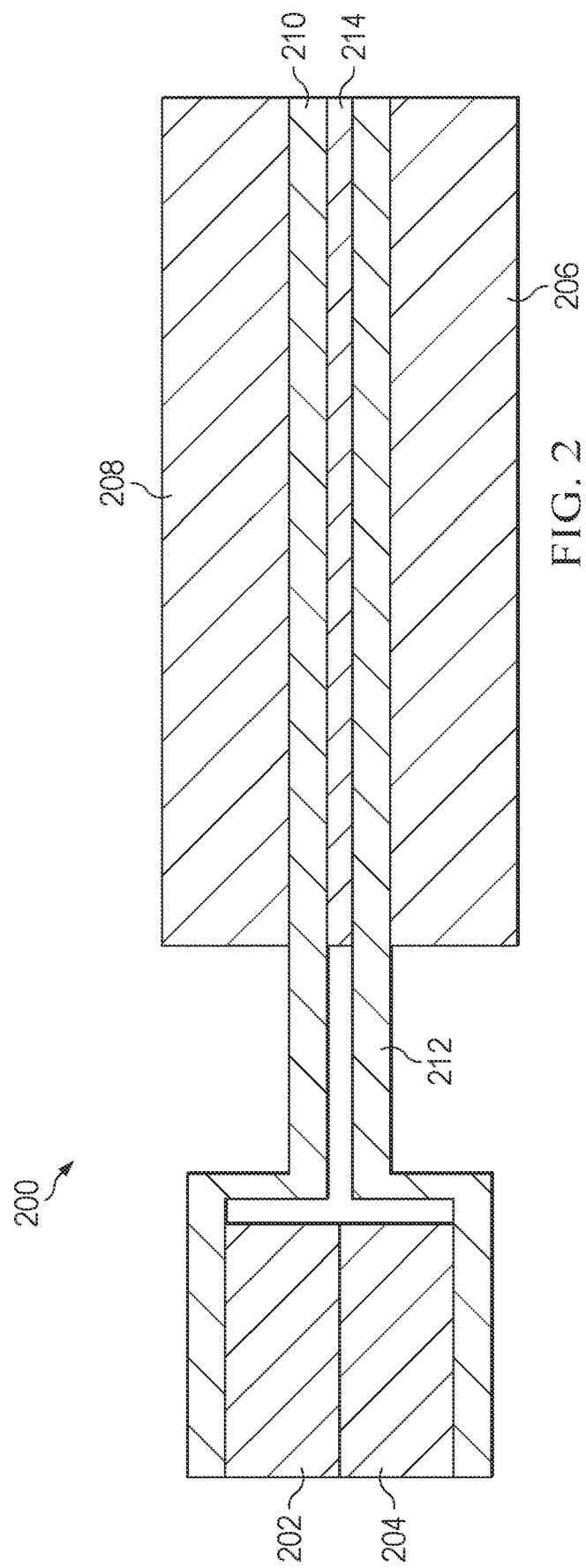
FIG. 2 illustrates a second example stacked arrangement of PCM-based conductive thermal actuator switches according to this disclosure.

FIG. 2 illustrates a second example stacked arrangement 200 of PCM-based conductive thermal actuator switches according to this disclosure. The stacked arrangement 200 here is similar to the stacked arrangement 100. As shown in FIG. 2, the stacked arrangement 200 includes multiple thermal actuator switches 202-204 that are thermally coupled in series. Each thermal actuator switch 202-204 may represent a separate instance of one of the thermal actuator switches described below, although each thermal actuator switch 202-204 may have any other suitable design in which a piston moves based on expansion/contraction of a phase change material.

In some embodiments, the thermal actuator switches 202-204 include different phase change materials. For instance, the thermal actuator switch 202 may have one or more phase change materials with a lower transition temperature, and the thermal actuator switch 204 may have one or more phase change materials with a higher transition temperature (or vice versa). In some cases, the lower transition temperature may be about 5° C., and the higher transition temperature may be about 25° C. This stacked arrangement 200 therefore allows one of the thermal actuator switches 202-204 to close (such as by expanding or contracting its phase change material) at lower temperatures and both of the thermal actuator switches 202-204 to close at higher temperatures. As a result, this helps to provide tunable thermal isolation in the "thru" direction.

The thermal actuator switches 202-204 are used with at least one heat source 206 and at least one heat sink 208. The at least one heat source 206 represents any suitable source of thermal energy, such as one or more batteries, processors, or other devices. The at least one heat sink 208 represents any suitable destination for the thermal energy, such as at least one cold plate. In this configuration, the stacked arrangement 200 is not physically positioned between the at least one heat source 206 and the at least one heat sink 208. Instead, the stacked arrangement 200 is positioned elsewhere, and thermal conductors 210 and 212 are used to thermally couple the thermal actuator switches 202 and 204 to the heat source(s) 206 and heat sink(s) 208. Each thermal conductor 210 and 212 represents any suitable structure configured to transfer thermal energy to or from a thermal actuator switch. Effectively, the thermal conductors 210 and 212 here function as heat straps to provide thermal energy to and from the stacked arrangement 200. Each thermal conductor 210 and 212 may be formed using any suitable material(s), such as one or more metals, a pyrolytic graphite sheet, or other material(s) having high thermal conductivity. Each thermal conductor 210 and 212 may also be formed in any suitable manner. In addition, each thermal conductor 210 and 212 may have any suitable size, shape, and dimensions.

A thermally-insulative material 214 may optionally be positioned between the thermal conductors 210 and 212 or portions of the thermal conductors 210 and 212. The thermally-insulative material 214 can help to reduce thermal conduction between the thermal conductors 210 and 212 in order to inhibit thermal energy transfer directly between the thermal conductors 210 and 212. The thermally-insulative material 214 may be formed from any suitable material(s), such as a thermally-insulative epoxy or other material(s) used to hold the thermal conductors 210 and 212 or a fiberglass sheet or other structure(s) positioned between the thermal conductors 210 and 212. As a particular example, the thermally-insulative material 214 may be formed using NEMA G10 from ADVANCED MATERIAL SCIENCE, LLC. The thermally-insulative material 214 may also be formed in any suitable manner. In addition, the thermally-insulative material 214 may have any suitable size, shape, and dimensions. Note that if the thermal conductors 210 and 212 extend beyond the thermally-insulative material 214 (as is shown in the embodiment of FIG. 2), the thermal conductors 210 and 212 may be reinforced if needed or desired. For instance, at least the portions of the thermal conductors 210 and 212 extending beyond the thermally-insulative material 214 may be formed using pyrolytic graphite sheets or other material(s) and reinforced using a polyimide film like Kapton or other reinforcement material(s).

In some embodiments, each of the stacked arrangements 100, 200 of PCM-based conductive thermal actuator switches 102-104, 202-204 may be implemented as follows. The thermal actuator switch 104, 204 that is activated (closed) to enable thermal energy transport through the switch 104, 204 at a higher temperature can be placed closer to a heat sink 108, 208. The thermal actuator switch 102, 202 that is activated (closed) to enable thermal energy transport through the switch 102, 202 at a lower temperature can be placed closer to a heat source 106, 206. This may be done to help prevent the thermal actuator switch 104, 204 with the higher activation temperature from "clamping" to a hot environmental temperature at some point that is beyond the control of the overall system (since there may be no active cooling in the loop). Instead, the thermal actuator switch 104, 204 with the higher activation temperature can be clamped to a colder temperature, which can be controlled (such as via a heater 110). In some cases, the way that the two stacked switches 102-104, 202-204 close and open can be opposite of one another, such as when one switch has a phase change material that expands at higher temperatures and the other switch has a phase change material that contracts at higher temperatures. In particular embodiments, water can be used in one of the stacked switches since it tends to behave in the opposite manner than many other phase change materials. Note, however, that the configurations of the switches 102-104, 202-204 can be adjusted as needed or desired so that the desired activations of the switches 102-104, 202-204 are achieved.

Although FIGS. 1 and 2 illustrate examples of stacked arrangements 100, 200 of PCM-based conductive thermal actuator switches 102-104, 202-204, various changes may be made to FIGS. 1 and 2. For example, a stacked arrangement of PCM-based conductive thermal actuator switches 102-104, 202-204 may be used in any suitable manner. Also, a stacked arrangement of PCM-based conductive thermal actuator switches 102-104, 202-204 may include more than two thermal actuator switches, and the thermal actuator switches may or may not include more than two phase change materials that expand/contract at different temperatures.

Figure 3:
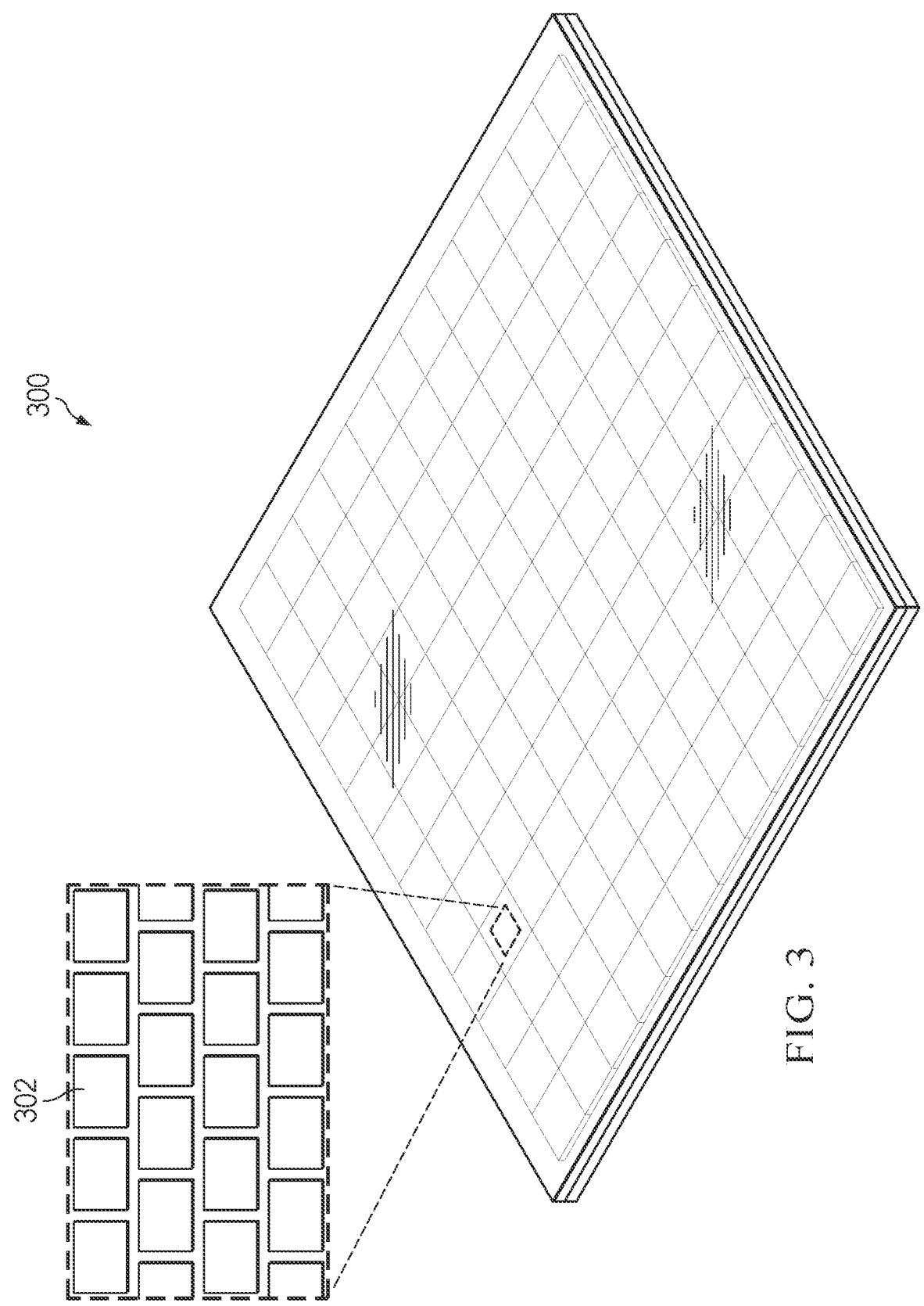
FIG. 3 illustrates an example array of PCM-based conductive thermal actuator switches according to this disclosure.

FIG. 3 illustrates an example array 300 of PCM-based conductive thermal actuator switches according to this disclosure. As shown in FIG. 3, the array 300 includes array elements, where each array element includes a thermal actuator switch 302. As can be seen here, the thermal actuator switches 302 are arranged in parallel, meaning the thermal actuator switches 302 can each independently be used to transfer thermal energy between at least one heat source and at least one heat sink. Each thermal actuator switch 302 may represent a separate instance of one of the thermal actuator switches described below, although each thermal actuator switch 302 may have any other suitable design in which a piston moves based on expansion/contraction of a phase change material. In some embodiments, each array element in the array 300 shown in FIG. 3 may include a stacked arrangement of multiple thermal actuator switches 302, such as the arrangement shown in FIG. 1.

The use of a parallel arrangement of thermal actuator switches 302 can help to control the temperature of one or more devices and to control a temperature gradient across the one or more devices. For example, the one or more devices can be maintained within a desired temperature range and can maintain a desired temperature gradient (or have a temperature gradient within a desired temperature gradient range) across one or more surfaces of the device(s). In this example, the thermal actuator switches 302 are generally arranged in rows, and the rows are staggered relative to one another (meaning each thermal actuator switch 302 is not aligned with thermal actuator switches 302 in the adjacent rows). This type of arrangement may be useful in helping to reduce or minimize lateral heat transfer between the thermal actuator switches 302. However, aligned thermal actuator switches 302 may also be used.

Note that the sizes of the thermal actuator switches 302 shown here can vary, as can the spacings between the thermal actuator switches 302 in each row and the spacings between the thermal actuator switches 302 in different rows. In some cases, the spaces between the thermal actuator switches 302 can be at least partially filled, such as by one or more thermally-insulative materials (like NEMA G10 or other materials) that help to limit thermal conduction substantially to the locations where the thermal actuator switches 302 are positioned.

Although FIG. 3 illustrates one example of an array 300 of PCM-based conductive thermal actuator switches 302, various changes may be made to FIG. 3. For example, a parallel arrangement of PCM-based conductive thermal actuator switches 302 may be used in any suitable manner. Also, an array 300 of PCM-based conductive thermal actuator switches 302 may include any suitable number of thermal actuator switches in any suitable layout.

Figure 4:
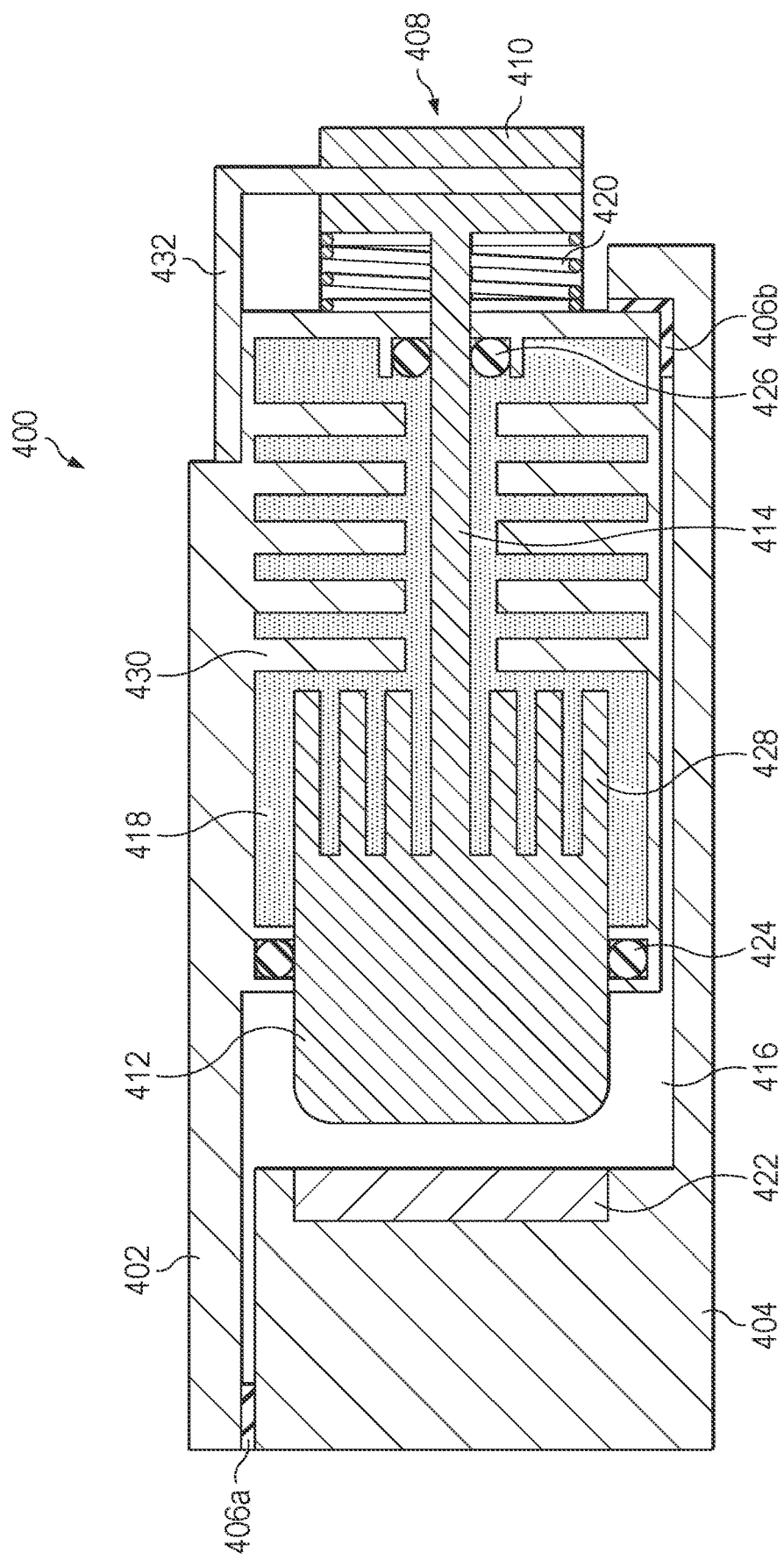
FIG. 4 illustrates a first example PCM-based conductive thermal actuator switch according to this disclosure.

FIG. 4 illustrates a first example PCM-based conductive thermal actuator switch 400 according to this disclosure. The thermal actuator switch 400 may, for example, represent one example implementation of each of the thermal actuator switches 102-104, 202-204, 302 that are described above as being used in the stacked arrangements 100, 200 or array 300. Note, however, that the thermal actuator switch 400 may be used in any other suitable device or system, and the thermal actuator switch 400 may be used individually or in a stacked arrangement and/or array.

As shown in FIG. 4, the thermal actuator switch 400 includes a housing, such as one formed using a top plate 402 and a bottom plate 404. Each plate 402 and 404 represents a structure that can be thermally coupled to at least one heat source or at least one heat sink. For example, the top plate 402 may be thermally coupled to at least one heat sink 108 or 208, and the bottom plate 404 may be thermally coupled to at least one heat source 106 or 206 (or vice versa). Each plate 402 and 404 may be formed using any suitable material(s), such as one or more metals or other material(s) having high thermal conductivity. Each plate 402 and 404 may also be formed in any suitable manner. In addition, each plate 402 and 404 may have any suitable size, shape, and dimensions.

In some embodiments, the plates 402 and 404 may optionally be separated from one another by a thermally-insulative material 406a-406b. The thermally-insulative material 406a-406b can help to reduce or minimize the thermal conductivity between the plates 402 and 404, which can help to reduce or minimize thermal energy transfer between the plates 402 and 404 themselves except when needed or desired. The thermally-insulative material 406a-406b may be formed from any suitable material(s), such as a thermally-insulative epoxy, resin, or other material(s) used to attach the plates 402 and 404 or fiberglass or other structure(s) positioned between the plates 402 and 404. The thermally-insulative material 406a-406b may also be formed in any suitable manner. In addition, the thermally-insulative material 406a-406b may have any suitable size, shape, and dimensions.

A piston 408 is formed by a piston head 410 and a piston plunger 412 that are attached, such as by a piston shaft 414. The piston 408 is positioned and movable laterally between the plates 402 and 404. For example, the top plate 402 and the bottom plate 404 may collectively define an internal cavity 416 in which at least part of the piston 408 can be positioned and can be movable right and left in FIG. 4. The piston 408 may be formed using any suitable material(s), such as one or more metals or other material(s) having high thermal conductivity. The piston 408 may also be formed in any suitable manner. In addition, the piston 408 may have any suitable size, shape, and dimensions. In some embodiments, the piston 408 is movable back and forth along an axis that is parallel or generally parallel to the outer surfaces of the top and bottom plates 402 and 404. Among other things, this may allow the piston 408 (along with a return mechanism described below) to achieve a thin cross-section within the internal cavity 416.

A phase change material 418 can be positioned within at least a portion of the internal cavity 416 defined by the top and bottom plates 402 and 404. The phase change material 418 represents at least one material that can expand and contract suitable amounts based on temperature. The phase change material 418 is used in the thermal actuator switch 400 to move the piston 408 between different positions in order to facilitate or inhibit thermal energy transfer between the top and bottom plates 402 and 404. For example, the phase change material 418 may expand (such as at higher temperatures) to push the piston plunger 412 into the top or bottom plate 402 or 404, and the phase change material 418 may contract (such as at lower temperatures) to allow the piston plunger 412 to be moved away from the top or bottom plate 402 or 404. When the piston plunger 412 contacts the top or bottom plate 402 or 404, a thermal pathway can be formed (or enhanced) between the top and bottom plates 402 and 404, which can enable (or improve) the transfer of thermal energy between the plates 402 and 404. When the piston plunger 412 is spaced from the top or bottom plate 402 or 404, a thermal pathway can be broken (or lessened) between the top and bottom plates 402 and 404, which can prevent (or lessen) the transfer of thermal energy between the plates 402 and 404.

In this particular example, the phase change material 418 can expand in order to push the piston plunger 412 into the bottom plate 404, and the phase change material 418 can contract in order to allow the piston plunger 412 to move away from the bottom plate 404. However, positioning the phase change material 418 to the left of the piston plunger 412 (rather than to the right of the piston plunger 412) in FIG. 4 may allow the phase change material 418 to contract in order to allow the piston plunger 412 to contact the bottom plate 404 and expand in order to push the piston plunger 412 away from the bottom plate 404. It is also possible to reposition a return mechanism described below so that the phase change material 418 can contract in order to allow the piston plunger 412 to be pushed into the bottom plate 404, and the phase change material 418 can expand in order to pull the piston plunger 412 away from the bottom plate 404.

When the phase change material 418 changes phase, the piston 408 may need external assistance in order to separate the piston 408 from the top or bottom plate 402 or 404 or to push the piston 408 into the top or bottom plate 402 or 404. For example, in the embodiment of FIG. 4, when the phase change material 418 contracts, the piston 408 may need external assistance in order to separate the piston 408 from the bottom plate 404. A return mechanism can therefore be provided in the thermal actuator switch 400, such as a return mechanism that biases the piston 408 in a particular position or that attempts to move the piston 408 in a particular direction (unless the force of the return mechanism is overcome by the phase change material 418). Any suitable return mechanism may be used here to provide the force needed to separate the piston 408 from the top or bottom plate 402 or 404 or to otherwise move the piston 408. In some embodiments, for example, one or more springs 420 can be used to push/pull the piston 408 away from the top or bottom plate 402 or 404.

In the particular arrangement in FIG. 4, one or more springs 420 can be used to pull the piston 408 away from the bottom plate 404, and the phase change material 418 may expand in order to push the piston 408 into the bottom plate 404. Thus, when the phase change material 418 is contracted, the spring(s) 420 can help to push the piston 408 away from the bottom plate 404. When the phase change material 418 expands, the spring force of the spring(s) 420 is overcome, which compresses the spring(s) 420 and allows the piston 408 to contact the bottom plate 404. However, the one or more springs 420 may be positioned so that the one or more springs 420 are used to push the piston 408 into the bottom plate 404, in which case the phase change material 418 may expand in order to pull the piston 408 away from the bottom plate 404 and towards the top plate 402. Note that the use of one or more springs 420 represents one example return mechanism for moving the piston 408. However, other return mechanisms are also possible, such as those using magnets. The use of the return mechanism may help to improve the operation of the thermal actuator switch 400 by enabling high cycling and reliability.

Various optional features may also be used in or with the thermal actuator switch 400. For example, at least one soft or pliant thermally-conductive material 422 (such as gold or other material) may be used to provide improved contact at a press fit between the piston plunger 412 and the top or bottom plate 402 or 404. In the example of FIG. 4, the piston plunger 412 is pushed into the bottom plate 404 by the phase change material 418 (although the piston plunger 412 may be pushed into the bottom plate 404 by the spring(s) 420 in other embodiments). Thus, the thermally-conductive material 422 in this example may be positioned within or on the bottom plate 404. However, the thermally-conductive material 422 may also or alternatively be positioned within or on the top plate 402 if needed or desired.

The internal cavity 416 in which the piston plunger 412 moves may contain a vacuum or may contain one or more gases that can help to reduce or minimize thermal energy transfer between the piston plunger 412 and the top or bottom plate 402 or 404. A vacuum may be formed internally within the thermal actuator switch 400 or externally, such as when the thermal actuator switch 400 is used inside an evacuated chamber. By thermally insulating the top and bottom plates 402 and 404 from one another and reducing or minimizing thermal energy transfer through the internal cavity 416, thermal energy may primarily flow between the top and bottom plates 402 and 404 via the piston 408 when the piston 408 is in contact with the bottom plate 404 in this example. As a result, thermal energy may primarily flow between the top and bottom plates 402 and 404 via the piston 408 only. In some cases, the phase change material 418 may be a poor conductor of thermal energy, meaning the dominant heat path between the top and bottom plates 402 and 404 can pass through the piston 408 once the thermal actuator switch 400 is closed.

One or more seals 424, 426 (such as one or more rubber or other O-rings or other types of seals) may be used to help seal the internal cavity 416 defined by the top and bottom plates 402 and 404. The one or more seals 424, 426 can help to prevent leakage of the phase change material 418 out of the internal cavity 416. The one or more seals 424, 426 can also or alternatively help to prevent leakage of air into the internal cavity 416 or leakage of one or more gasses out of the internal cavity 416.

Carbon nanotubes or other material(s) may be mixed with the phase change material 418, such as when the carbon nanotubes or other material(s) can be used to change the behavior of the phase change material 418. As particular examples, carbon nanotubes or other material(s) may be used to change the expansion rate, contraction rate, and/or transition temperature(s) of the phase change material 418. As a result, this can be used to tune one or more operational characteristics of the thermal actuator switch 400. As a particular example, carbon nanotubes up to a 0.5% weight fraction of the phase change material 418 may be used in the thermal actuator switch 400, although other amounts of carbon nanotubes or other material(s) may be used in the phase change material 418.

Fins 428 and/or fins 430 can be used to provide larger surface area(s) for thermal energy transfer. In this example, the fins 428 are used on the piston 408 (such as the piston plunger 412) in order to increase thermal energy transfer between the piston 408 and the phase change material 418. Also, in this example, the fins 430 are used on the top plate 402 in order to increase thermal energy transfer between the top plate 402 and the phase change material 418. This may help to improve thermal energy transfer in the thermal actuator switch 400, making the thermal actuator switch 400 more responsive to changes in environmental temperatures.

At least one heat strap 432 may be used to facilitate the transfer of thermal energy between the top or bottom plate 402 or 404 and the piston 408 in order to improve thermal energy transfer. In this example, a heat strap 432 extends from the top plate 402 to the piston 408 and allows thermal energy to be transferred directly from the top plate 402 to the piston 408 (rather than indirectly via the phase change material 418). The heat strap 432 may be formed using any suitable thermally-conductive material(s), such as one or more pyrolytic graphite sheets. In some embodiments, the heat strap(s) 432 can have sufficient length that provides for strain relief. Any exposed portions of the heat strap 432 may be encapsulated (such as by using a polyimide film) in order to provide protection for the heat strap 432. The heat strap 432 may also be coupled to the top or bottom plate 402 or 404 and to the piston 408 in any suitable manner, such as when the heat strap 432 is clamped or soldered to the top or bottom plate 402 or 404 and is secured to the piston head 410 using a screw or other physical connector.

Note that while the heat strap 432 is shown here as being outside the internal cavity 416 and away from the phase change material 418, one or more pyrolytic graphite sheets or other heat strap(s) 432 formed using thermally-conductive material(s) may also or alternatively be used within the top plate or bottom plate 402 or 404 or within the phase change material 418 itself (and optionally coupled to the piston 408) to improve thermal energy transfer. Also note again that the phase change material 418 may be a poor conductor of thermal energy in some cases, and the dominant heat path between the plates 402 and 404 can pass through the heat strap 432 and the piston 408 in this example once the thermal actuator switch 400 is closed.

Figure 5:
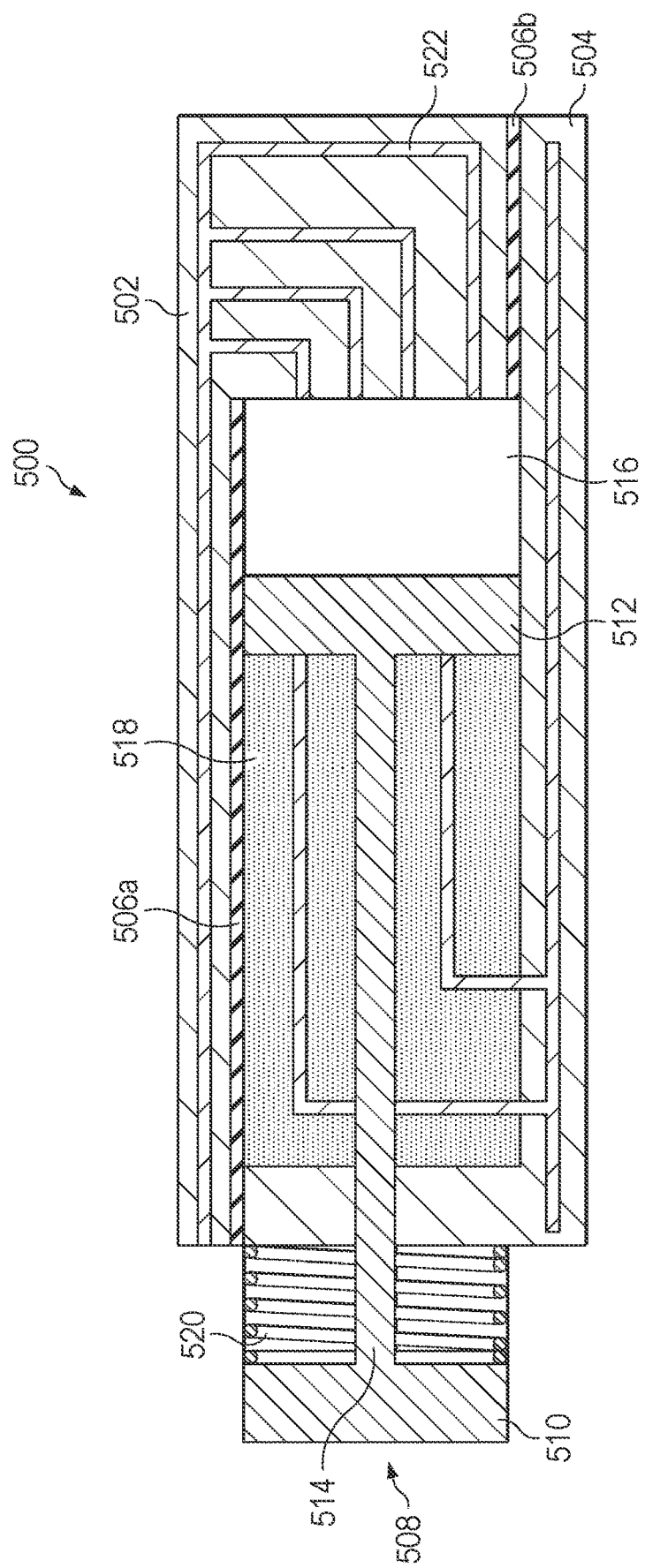
FIG. 5 illustrates a second example PCM-based conductive thermal actuator switch according to this disclosure.

FIG. 5 illustrates a second example PCM-based conductive thermal actuator switch 500 according to this disclosure. The thermal actuator switch 500 may, for example, represent another example implementation of each of the thermal actuator switches 102-104, 202-204, 302 that are described above as being used in the stacked arrangements 100, 200 or array 300. Note, however, that the thermal actuator switch 500 may be used in any other suitable device or system, and the thermal actuator switch 500 may be used individually or in a stacked arrangement and/or array.

As shown in FIG. 5, the thermal actuator switch 500 includes a housing, such as one formed using a top plate 502 and a bottom plate 504. Each plate 502 and 504 represents a structure that can be thermally coupled to at least one heat source or at least one heat sink. For example, the top plate 502 may be thermally coupled to at least one heat sink 108 or, and the bottom plate 504 may be thermally coupled to at least one heat source 106 or 206 (or vice versa). Each plate 502 and 504 may be formed using any suitable material(s), such as one or more metals or other material(s) having high thermal conductivity. Each plate 502 and 504 may also be formed in any suitable manner. In addition, each plate 502 and 504 may have any suitable size, shape, and dimensions.

In some embodiments, the plates 502 and 504 may optionally be separated by a thermally-insulative material 506a-506b. The thermally-insulative material 506a-506b can help to reduce or minimize the thermal conductivity between the plates 502 and 504, which can help to reduce or minimize thermal energy transfer between the plates 502 and 504 themselves except when needed or desired. The thermally-insulative material 506a-506b may be formed from any suitable material(s), such as a thermally-insulative epoxy, resin, or other material(s) used to attach the plates 502 and 504 or fiberglass or other structure(s) positioned between the plates 502 and 504. The thermally-insulative material 506a-506b may also be formed in any suitable manner. In addition, the thermally-insulative material 506a-506b may have any suitable size, shape, and dimensions.

A piston 508 is formed by a piston head 510 and a piston plunger 512 that are attached, such as by a piston shaft 514. The piston 508 is positioned and movable laterally between the plates 502 and 504. For example, the top plate 502 and the bottom plate 504 may collectively define an internal cavity 516 in which at least part of the piston 508 can be positioned and can be movable right and left in FIG. 5. The piston 508 may be formed using any suitable material(s), such as one or more metals or other material(s) having high thermal conductivity. The piston 508 may also be formed in any suitable manner. In addition, the piston 508 may have any suitable size, shape, and dimensions. In some embodiments, the piston 508 is movable back and forth along an axis that is parallel or generally parallel to the outer surfaces of the top and bottom plates 502 and 504. Among other things, this may allow the piston 508 (along with a return mechanism described below) to achieve a thin cross-section within the internal cavity 516.

A phase change material 518 can be positioned within at least a portion of the internal cavity 516 defined by the top and bottom plates 502 and 504. The phase change material 518 represents at least one material that can expand and contract suitable amounts based on temperature. The phase change material 518 is used in the thermal actuator switch 500 to move the piston 508 between different positions in order to facilitate or inhibit thermal energy transfer between the top and bottom plates 502 and 504. For example, the phase change material 518 may expand (such as at higher temperatures) to push the piston plunger 512 into the top or bottom plate 502 or 504, and the phase change material 518 may contract (such as at lower temperatures) to allow the piston plunger 512 to be moved away from the top or bottom plate 502 or 504. When the piston plunger 512 contacts the top or bottom plate 502 or 504, a thermal pathway can be formed (or enhanced) between the top and bottom plates 502 and 504, which can enable (or improve) the transfer of thermal energy between the plates 502 and 504. When the piston plunger 512 is spaced from the top or bottom plate 502 or 504, a thermal pathway can be broken (or lessened) between the top and bottom plates 502 and 504, which can prevent (or lessen) the transfer of thermal energy between the plates 502 and 504.

In this particular example, the phase change material 518 can expand in order to push the piston plunger 512 into the top plate 502, and the phase change material 518 can contract in order to allow the piston plunger 512 to move away from the top plate 502. However, positioning the phase change material 518 to the right of the piston plunger 512 (rather than to the left of the piston plunger 512) in FIG. 5 may allow the phase change material 518 to contract in order to allow the piston plunger 512 to contact the top plate 502 and expand in order to pull the piston plunger 512 away from the top plate 502.

When the phase change material 518 changes phase, the piston 508 may need external assistance in order to separate the piston 508 from the top or bottom plate 502 or 504 or to push the piston 508 into the top or bottom plate 502 or 504. For example, in the embodiment of FIG. 5, when the phase change material 518 contracts, the piston 508 may need external assistance in order to separate the piston 508 from the top plate 502. A return mechanism can therefore be provided in the thermal actuator switch 500, such as a return mechanism that biases the piston 508 in a particular position or that attempts to move the piston 508 in a particular direction (unless the force of the return mechanism is overcome by the phase change material 518). Any suitable return mechanism may be used here to provide the force needed to separate the piston 508 from the top or bottom plate 502 or 504 or to otherwise move the piston 508. In some embodiments, for example, one or more springs 520 can be used to push/pull the piston 508 away from the top or bottom plate 502 or 504.

In the particular arrangement in FIG. 5, one or more springs 520 can be used to pull the piston 508 away from the top plate 502, and the phase change material 518 may expand in order to push the piston 508 into the top plate 502. Thus, when the phase change material 518 is contracted, the spring(s) 520 can help to push the piston 508 away from the top plate 502. When the phase change material 518 expands, the spring force of the spring(s) 520 is overcome, which compresses the spring(s) 520 and allows the piston 508 to contact the top plate 502. However, the one or more springs 520 may be positioned so that the one or more springs 520 are used to push the piston 508 into the top plate 502, in which case the phase change material 518 may expand in order to pull the piston 508 away from the top plate 502 and towards the bottom plate 504. Note that the use of one or more springs 520 represents one example return mechanism for moving the piston 508. However, other return mechanisms are also possible, such as those using magnets. The use of the return mechanism may help to improve the operation of the thermal actuator switch 500 by enabling high cycling and reliability.

Again, various optional features may also be used in or with the thermal actuator switch 500. For example, at least one soft or pliant thermally-conductive material (such as gold or other material) may be used to provide improved contact at a press fit between the piston plunger 512 and the top or bottom plate 502 or 504. The internal cavity 516 in which the piston plunger 512 moves may contain a vacuum or may contain one or more gases that can help to reduce or minimize thermal energy transfer between the piston plunger 512 and the top or bottom plate 502 or 504. One or more seals (such as one or more rubber or other O-rings or other types of seals) may be used to help seal the internal cavity 516 defined by the top and bottom plates 502 and 504. Carbon nanotubes or other material(s) may be mixed with the phase change material 518, such as when the carbon nanotubes or other material(s) can be used to change the behavior of the phase change material 518 (like its expansion rate, contraction rate, and/or transition temperature) and thereby tune one or more operational characteristics of the thermal actuator switch 500. Fins can be used to provide larger surface area(s) for thermal energy transfer, such as fins on the piston 508, the top plate 502, and/or the bottom plate 504.

At least one heat strap 522 may be used to facilitate the transfer of thermal energy between the top or bottom plate 502 or 504 and the piston 508 in order to improve thermal energy transfer. In this example, multiple heat straps 522 extend through the top plate 502, and multiple heat straps 522 extend through the bottom plate 504 and through the phase change material 518. The heat straps 522 facilitate thermal energy transfer to and from the piston 508, which helps to facilitate thermal energy transfer between the top and bottom plates 502 and 504. Each heat strap 522 may be formed using any suitable thermally-conductive material(s), such as one or more pyrolytic graphite sheets. If necessary, at least one of the heat straps 522 can have sufficient length that provides for strain relief, and any exposed portions of each heat strap 522 may be encapsulated (such as by using a polyimide film).

Note that while the heat straps 522 are shown here as being within the top and bottom plates 502 and 504 and within the internal cavity 516, one or more pyrolytic graphite sheets or other heat strap(s) 522 formed using thermally-conductive material(s) may also or alternatively be used on the outside of the thermal actuator switch 500. For instance, at least one heat strap 522 may be clamped, soldered, or otherwise connected to the bottom plate 504 and screwed or otherwise connected to the piston head 510 or another portion of the piston 508. Also note that the phase change material 518 may be a poor conductor of thermal energy in some cases, and the dominant heat path between the plates 502 and 504 can pass through the heat strap(s) 532 and the piston 508 in this example once the thermal actuator switch 500 is closed.

In this way, each thermal actuator switch 400, 500 uses the phase change material 418, 518 to passively control heat transfer between the heat source(s) and the heat sink(s) that are thermally coupled to its top and bottom plates 402-404, 502-504. That is, each thermal actuator switch 400, 500 can use the volumetric expansion and volumetric contraction properties of its phase change material 418, 518 to actuate its piston 408, 508 between two positions. In some cases, the movement of the piston 408, 508 may be performed in a completely passive manner, meaning the piston 408, 508 is moved due to the expansion and contraction of the phase change material 418, 518 based on thermal energy received from the heat source(s) and rejected to the heat sink(s). No additional heaters or coolers may be required here to cause expansion or contraction of the phase change material 418, 518 (although that may not be the case in other embodiments).

Moreover, each thermal actuator switch 400, 500 here may allow for rigid contact between the heat source(s) and the heat sink(s). In some cases, each thermal actuator switch 400, 500 allows for rigid contact in the entire volume between the heat source(s) and the heat sink(s). This is because the top and bottom plates 402-404, 502-504 can be securely coupled to one another, which in some cases can provide large stable surfaces along the top of the top plate 402, 502 and along the bottom of the bottom plate 404, 504 (such as for mechanical couplings). In addition, depending on the design of each thermal actuator switch 400, 500, each thermal actuator switch 400, 500 can provide for tunable thermal isolation in the "thru" direction (vertically in FIGS. 4 and 5) and tunable thermal isolation in the "in-plane" direction (horizontally in FIGS. 4 and 5).

Various types of phase change materials 418, 518 may be used in the thermal actuator switches 400, 500 depending on the implementation. Examples of phase change materials 418, 518 that may be used include water, paraffin wax, salt hydrate, solder, or indium alloy. In some embodiments, the phase change material 418, 518 is selected so that the phase change material 418, 518 contracts at lower temperatures and expands at higher temperatures. Various forms of paraffin wax, salt hydrate, solder, and indium alloy are examples of phase change materials 418, 518 that behave in this manner. In other embodiments, the phase change material 418, 518 is selected so that the phase change material expands at lower temperatures and contracts at higher temperatures. Water is an example of a phase change material 418, 518 that behaves in this manner. Thus, the selection of the phase change material 418, 518 to be used can depend (at least in part) on (i) whether a thermal connection between top and bottom plates 402-404, 502-504 is formed or improved in response to expansion or contraction of the phase change material 418, 518 and (ii) whether the thermal connection between the top and bottom plates 402-404, 502-504 is broken or lessened in response to expansion or contraction of the phase change material 418, 518.

Note that the heat source(s) and the heat sink(s) used with each thermal actuator switch 400, 500 may represent any suitable source(s) and destination(s) for thermal energy. For example, in a "cold environment" scenario, at least one heater may be used to heat one or more devices. In this scenario, the one or more devices to be heated can represent the heat source, and at least one cold plate can be provided that represents the heat sink. Here, one or more thermal actuator switches 400, 500 can be used to remove excess thermal energy from the one or more devices to the cold plate(s), such as when excessive thermal energy is provided to the one or more devices by the heater. In this example, limited heater power may be conserved while increasing or maximizing structural support for the one or more devices (since the thermal actuator switches 400, 500 may primarily remain in the opened position (with the pistons 408, 508 separated from the top or bottom plates 402-404, 502-504). The one or more devices here may represent any suitable device(s) to be heated, such as one or more batteries, processors, or other devices used in a cold environment (like in space applications). In some cases, the one or more thermal actuator switches 400, 500 can be opened and closed to help keep the one or more devices between upper and lower target operating temperatures or within a target operating temperature range.

In a "hot environment" scenario, one or more devices may generate heat, and at least one cold plate can be used to receive thermal energy from the one or more devices in order to cool the one or more devices. In this scenario, the one or more devices can represent the heat source, and the at least one cold plate can represent the heat sink. Here, one or more thermal actuator switches 400, 500 can be used to facilitate the transfer of thermal energy between the one or more devices and the cold plate(s). In this example, thermal energy dissipation to the heat sink may be maximized, such as when the thermal actuator switches 400, 500 primarily remain in the closed position (with the pistons 408, 508 contacting the top or bottom plates 402-404, 502-504). The one or more devices here may represent any suitable device(s) to be cooled, such as one or more batteries, processors, or other devices. Again, in some cases, the one or more thermal actuator switches 400, 500 can be opened and closed to maintain the one or more devices between upper and lower target operating temperatures or within a target operating temperature range.

One or more instances of each thermal actuator switch 400, 500 may find use in a large number of applications. For example, the thermal actuator switches 400, 500 may be used in numerous devices where batteries, processors, or other components need to be maintained at specified temperatures or within specified temperature ranges. As particular examples, the thermal actuator switches 400, 500 may be used in satellites, unmanned aerial vehicles, and other systems where limiting power consumption may be necessary or desirable and where passive designs can improve long-term reliability. As other particular examples, the thermal actuator switches 400, 500 may be used in manufacturing systems or manufacturing messaging systems, such as in additive manufacturing systems. In general, this disclosure is not limited to any particular application of the thermal actuator switches 400, 500, and this disclosure is not limited to any particular types of heat source(s) and heat sink(s) used with the thermal actuator switches 400, 500.

Although FIGS. 4 and 5 illustrate examples of PCM-based conductive thermal actuator switches 400, 500, various changes may be made to FIGS. 4 and 5. For example, the sizes, shapes, and dimensions of each thermal actuator switch 400, 500 and its components may vary as needed or desired. For instance, each piston's shape or aspect ratio may be optimized to achieve a desired balance between travel and force. Also, one or more thermal interface materials may be used at the contact interfaces between each thermal actuator switch 400, 500 and the heat source(s)/heat sink(s) to limit thermal resistance. Moreover, one or more surfaces (such as the inner surfaces of the top and bottom plates 402-404, 502-504 or the outer surface of the piston plunger 412, 512) may represent one or more low emissivity surfaces, which can help to reduce radiative thermal energy exchange. Surfaces can achieve low emissivity in various ways, such as with suitable coatings, conversion coatings, and/or polishing. Further, multiple phase change materials 418, 518 may be used in each thermal actuator switch 400, 500, such as when the housing of the thermal actuator switch 400, 500 (formed by its top and bottom plates 402-404, 502-504) can handle appropriate stresses near the transition temperatures of the phase change materials 418, 518. In addition, in the examples shown here, the piston 408 in one switch 400 can move towards and away from the bottom plate 404, and the piston 508 in another switch 500 can move towards and away from the top plate 502. However, each switch 400, 500 can be configured to allow the piston 408, 508 to move towards and away from the top plate 402, 502 or towards and away from the bottom plate 404, 504. Finally, in the examples shown here, each piston 408, 508 moves away from the top or bottom plate 402-404, 502-504 when the phase change material 418, 518 contracts and moves towards the top or bottom plate 402-404, 502-504 when the phase change material 418, 518 expands. However, in other embodiments, the phase change material 418, 518 may expand to move the piston 408, 508 away from the top or bottom plate 402-404, 502-504 and contract to allow the piston 408, 508 to move towards the top or bottom plate 402-404, 502-504.

It should be noted that while "top" and "bottom" are used to describe the plates 402-404, 502-504 of the thermal actuator switches 400, 500, this does not impart any structural or usage limitations on the thermal actuator switches 400, 500. The terms "top" and "bottom" are used merely as a matter of convenience to refer to the positions of the plates 402-404, 502-504 as specifically shown in the figures. Each of the thermal actuator switches 400, 500 can be implemented or used in an inverted manner, in a sideways orientation, or in any other suitable orientation or configuration as needed or desired. It should also be noted that any suitable combination of features shown in FIGS. 4 and 5 could be used in a single thermal actuator switch, whether or not that specific combination of features is shown in the figures or described above. Thus, for instance, the thermal actuator switch 500 may include one or more seals 424, 426, fins 428, fins 430, thermally-conductive material 422, heat straps 432, and/or other or additional features shown in the thermal actuator switch 400. The thermal actuator switch 400 may include one or more heat straps 522 and/or other or additional features shown in the thermal actuator switch 500.

The following describes example embodiments of this disclosure that implement or relate to PCM-based conductive thermal actuator switches and associated stacked and arrayed systems. However, other embodiments may be used in accordance with the teachings of this disclosure.

In a first embodiment, an apparatus includes a thermal actuator switch configured to control a transfer of thermal energy through the thermal actuator switch. The thermal actuator switch includes first and second plates and a piston movable laterally between the first and second plates. The thermal actuator switch also includes a phase change material configured to (i) expand to move a surface of the piston into a first position and (ii) contract to allow the surface of the piston to move into a second position. The surface of the piston thermally contacts the first plate and increases thermal energy transfer between the first and second plates when in one of the first and second positions. The surface of the piston is spaced apart from the first plate and decreases thermal energy transfer between the first and second plates when in another of the first and second positions.

Any single one or any suitable combination of the following features may be used with the first embodiment. The piston may include a head coupled to a plunger by a shaft. The phase change material may be configured to push against the plunger to move the piston closer to the first plate. The plunger may include fins configured to contact the phase change material. The thermal actuator switch may include a soft or pliant material in one of the first and second plates, and the plunger may be configured to contact the soft or pliant material. At least one of the first and second plates may include fins configured to contact the phase change material. The thermal actuator switch may include at least one heat strap coupling at least one of the first and second plates to the piston. The thermal actuator switch may include at least one thermally-insulative material positioned between and separating the first and second plates. An internal cavity defined between the first and second plates may include one of a vacuum or one or more gases configured to inhibit thermal energy transfer between the piston and the first plate. The thermal actuator switch may include at least one heat strap extending through at least one of the first and second plates.

In a second embodiment, a system includes at least one heat source, at least one heat sink, and multiple thermal actuator switches configured to control a transfer of thermal energy between the at least one heat source and the at least one heat sink. Each thermal actuator switch includes first and second plates and a piston movable laterally between the first and second plates. Each thermal actuator switch also includes a phase change material configured to (i) expand to move a surface of the piston into a first position and (ii) contract to allow the surface of the piston to move into a second position. The surface of the piston thermally contacts the first plate and increases thermal energy transfer between the first and second plates when in one of the first and second positions. The surface of the piston is spaced apart from the first plate and decreases thermal energy transfer between the first and second plates when in another of the first and second positions.

Any single one or any suitable combination of the following features may be used with the second embodiment. In each thermal actuator switch, the piston may include a head coupled to a plunger by a shaft. In each thermal actuator switch, the phase change material may be configured to push against the plunger to move the piston closer to the first plate. In each thermal actuator switch, the plunger may include fins configured to contact the phase change material. In each thermal actuator switch, the thermal actuator switch may include a soft or pliant material in one of the first and second plates, and the plunger may be configured to contact the soft or pliant material. In each thermal actuator switch, at least one of the first and second plates may include fins configured to contact the phase change material. In each thermal actuator switch, the thermal actuator switch may include at least one of one or more heat straps coupling at least one of the first and second plates to the piston or one or more heat straps extending through at least one of the first and second plates. In each thermal actuator switch, the thermal actuator switch may include at least one thermally-insulative material positioned between and separating the first and second plates. In each thermal actuator switch, an internal cavity defined between the first and second plates may include one of a vacuum or one or more gases configured to inhibit thermal energy transfer between the piston and the first plate. At least some of the thermal actuator switches may be arranged in parallel between the at least one heat source and the at least one heat sink. At least some of the thermal actuator switches may be arranged in a stacked configuration between the at least one heat source and the at least one heat sink.

In a third embodiment, a method includes receiving thermal energy at a thermal actuator switch from at least one heat source. The method also includes controlling a transfer of the thermal energy between the at least one heat source and at least one heat sink using the thermal actuator switch. The thermal actuator switch includes first and second plates and a piston that moves laterally between the first and second plates. The thermal actuator switch also includes a phase change material that (i) expands to move a surface of the piston into a first position and (ii) contracts to allow the surface of the piston to move into a second position. The surface of the piston thermally contacts the first plate and increases thermal energy transfer between the first and second plates when in one of the first and second positions. The surface of the piston is spaced apart from the first plate and decreases thermal energy transfer between the first and second plates when in another of the first and second positions. Any single one or any suitable combination of the features above may be used with the third embodiment.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
    a thermal actuator switch configured to control a transfer of thermal energy through the thermal actuator switch, the thermal actuator switch comprising:
        a first plate and a second plate, the first plate separated from the second plate by a thermally-insulative material;
        an enclosed internal cavity defined by each of the first plate and the second plate;
        a piston at least partially disposed within the internal cavity and movable laterally between the first plate and the second plate, and
        a phase change material at least partially disposed within the internal cavity and configured to (i) expand to move a surface of the piston into a first position and (ii) contract to allow the surface of the piston to move into a second position, the surface of the piston thermally contacting the first plate and increasing thermal energy transfer between the first plate and the second plate when in one of the first position and the second position, the surface of the piston spaced apart from the first plate and decreasing thermal energy transfer between the first plate and the second plate when in another of the first position and the second position.

2. The apparatus of claim 1, wherein:
    the piston comprises a head coupled to a plunger by a shaft; and
    the phase change material is configured to push against the plunger to move the piston closer to the first plate.

3. The apparatus of claim 1, wherein:
    the piston comprises a head coupled to a plunger by a shaft configured to contact the phase change material; and the plunger comprises a plurality of fins extending toward the head and configured to contact the phase change material.

4. The apparatus of claim 3, wherein the thermal actuator switch further comprises a soft or pliant material in one of the first plate and the second plate, the plunger configured to contact the soft or pliant material.

5. The apparatus of claim 1, wherein at least one of the first plate and the second plate comprises a plurality of fins extending into the internal cavity and configured to contact the phase change material.

6. The apparatus of claim 1, wherein the thermal actuator switch further comprises at least one heat strap coupling at least one of the first plate and the second plate to the piston.

7. The apparatus of claim 1, wherein the thermally-insulative material comprises a thermally-insulative epoxy.

8. The apparatus of claim 1, wherein the internal cavity defined between the first plate and the second plate comprises one of:
 a vacuum; or
 one or more gases configured to inhibit thermal energy transfer between the piston and the first plate.

9. The apparatus of claim 1, wherein the thermal actuator switch further comprises at least one heat strap extending through at least one of the first plate and the second plate.

10. A system comprising:
 at least one heat source;
 at least one heat sink; and
 multiple thermal actuator switches configured to control a transfer of thermal energy between the at least one heat source and the at least one heat sink, each of the thermal actuator switches comprising:
  a first plate and a second plate, the first plate separated from the second plate by a thermally-insulative material;
  an enclosed internal cavity defined by each of the first plate and the second plate;
  a piston at least partially disposed within the internal cavity and movable laterally between the first plate and the second plate; and
  a phase change material at least partially disposed within the internal cavity and configured to (i) expand to move a surface of the piston into a first position and (ii) contract to allow the surface of the piston to move into a second position, the surface of the piston thermally contacting the first plate and increasing thermal energy transfer between the first plate and the second plate when in one of the first position and the second position, the surface of the piston spaced apart from the first plate and decreasing thermal energy transfer between the first plate and the second plate when in another of the first position and the second position.

11. The system of claim 10, wherein, in each thermal actuator switch:
 the piston comprises a head coupled to a plunger by a shaft; and
 the phase change material is configured to push against the plunger to move the piston closer to the first plate.

12. The system of claim 10, wherein, in each thermal actuator switch:
 the piston comprises a head coupled to a plunger by a shaft configured to contact the phase change material; and
 the plunger comprises a plurality of fins extending toward the head and configured to contact the phase change material.

13. The system of claim 12, wherein, in each thermal actuator switch, the thermal actuator switch further comprises a soft or pliant material in one of the first plate and the second plate, the plunger configured to contact the soft or pliant material.

14. The system of claim 10, wherein, in each thermal actuator switch, at least one of the first plate and the second plate comprises a plurality of fins extending into the internal cavity and configured to contact the phase change material.

15. The system of claim 10, wherein, in each thermal actuator switch, the thermal actuator switch further comprises at least one of:
 one or more heat straps coupling at least one of the first plate and the second plate to the piston; and
 one or more heat straps extending through at least one of the first plate and the second plate.

16. The system of claim 10, wherein, in each thermal actuator switch, the thermally-insulative material comprises a thermally-insulative epoxy.

17. The system of claim 10, wherein, in each thermal actuator switch, the internal cavity defined between the first plate and the second plate comprises one of:
 a vacuum; or
 one or more gases configured to inhibit thermal energy transfer between the piston and the first plate.

18. The system of claim 10, wherein at least some of the thermal actuator switches are arranged in parallel between the at least one heat source and the at least one heat sink.

19. The system of claim 10, wherein at least some of the thermal actuator switches are arranged in a stacked configuration between the at least one heat source and the at least one heat sink.

20. A method comprising:
 receiving thermal energy at a thermal actuator switch from at least one heat source; and
 controlling a transfer of the thermal energy between the at least one heat source and at least one heat sink using the thermal actuator switch;
 wherein the thermal actuator switch comprises:
  a first plate and a second plate, the first plate separated from the second plate by a thermally-insulative material;
  an enclosed internal cavity defined by each of the first plate and the second plate;
  a piston at least partially disposed within the internal cavity that moves laterally between the first plate and the second plate; and
 a phase change material at least partially disposed within the internal cavity that (i) expands to move a surface of the piston into a first position and (ii) contracts to allow the surface of the piston to move into a second position, the surface of the piston thermally contacting the first plate and increasing thermal energy transfer between the first plate and the second plate when in one of the first position and the second position, the surface of the piston spaced apart from the first plate and decreasing thermal energy transfer between the first plate and the second plate when in another of the first position and the second position.

* * * * *